United States Patent
Kim et al.

(10) Patent No.: US 10,014,285 B2
(45) Date of Patent: Jul. 3, 2018

(54) SEMICONDUCTOR DEVICES

(71) Applicant: Samsung Electronics Co., Ltd., Suwon-si, Gyeonggi-do (KR)

(72) Inventors: Sun-Hyun Kim, Anyang-si (KR); Seung-Hoon Kim, Seoul (KR); Sang-Il Jung, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/212,615

(22) Filed: Jul. 18, 2016

(65) Prior Publication Data

US 2017/0040253 A1 Feb. 9, 2017

(30) Foreign Application Priority Data

Aug. 5, 2015 (KR) .................. 10-2015-0110564

(51) Int. Cl.
*H01L 23/528* (2006.01)
*H01L 25/18* (2006.01)
(Continued)

(52) U.S. Cl.
CPC ............... *H01L 25/18* (2013.01); *G02F 1/13* (2013.01); *H01L 23/481* (2013.01); *H01L 27/1464* (2013.01); *H01L 27/14636* (2013.01); *H01L 23/3142* (2013.01); *H01L 23/53276* (2013.01); *H01L 24/17* (2013.01);
(Continued)

(58) Field of Classification Search
CPC ... H01L 25/18; H01L 23/481; H01L 27/1464; H01L 27/14636; H01L 23/53276; H01L 2224/16227; H01L 24/17; H01L 2924/1431; H01L 23/3142; H01L 2924/1443; H01L 2924/1438; H01L 2224/16146; G02F 1/13
See application file for complete search history.

(56) References Cited

U.S. PATENT DOCUMENTS 8,378,399 B2 2/2013 Maeda
8,421,238 B2 4/2013 Inagaki
(Continued)

FOREIGN PATENT DOCUMENTS

KR          0781872      1/2003
KR       2013-0100661   9/2013
KR       2013-0134791  12/2013

*Primary Examiner* — Marc Armand
*Assistant Examiner* — Sue Tang
(74) *Attorney, Agent, or Firm* — Harness, Dickey & Pierce, P.L.C.

(57) ABSTRACT

A semiconductor device may include a first conductive pattern disposed in a first interlayer insulating film, a second conductive pattern disposed in a second interlayer insulating film positioned on the first interlayer insulating film, a through electrode partially penetrating through the first interlayer insulating film and the second interlayer insulating film. The through electrode electrically connects the first conductive pattern and the second conductive pattern. The device further includes a first pattern completely surrounding side surfaces of the through electrode, and a second pattern between the first pattern and the through electrode. The second pattern is separated from the first pattern and the through electrode. The device includes a third pattern connecting the first pattern and the second pattern.

13 Claims, 17 Drawing Sheets

(51) Int. Cl.
   *H01L 23/48* (2006.01)
   *H01L 27/146* (2006.01)
   *G02F 1/13* (2006.01)
   *H01L 23/00* (2006.01)
   *H01L 23/31* (2006.01)
   *H01L 23/532* (2006.01)

(52) U.S. Cl.
   CPC ............... *H01L 2224/16146* (2013.01); *H01L 2224/16227* (2013.01); *H01L 2924/1431* (2013.01); *H01L 2924/1434* (2013.01); *H01L 2924/1438* (2013.01); *H01L 2924/1443* (2013.01)

(56) References Cited

U.S. PATENT DOCUMENTS

| | | | |
|---|---|---|---|
| 8,742,590 B2 | 6/2014 | Beyne | |
| 8,742,591 B2 | 6/2014 | Choi et al. | |
| 8,772,899 B2 | 7/2014 | JangJian et al. | |
| 8,836,065 B2 | 9/2014 | Hayakawa et al. | |
| 9,025,063 B2 | 5/2015 | Ahn et al. | |
| 2010/0244251 A1* | 9/2010 | Torazawa | H01L 21/76805 257/741 |
| 2010/0283130 A1* | 11/2010 | Nishio | H01L 21/76898 257/621 |
| 2011/0193197 A1* | 8/2011 | Farooq | H01L 23/53228 257/618 |
| 2013/0127067 A1 | 5/2013 | Cheng et al. | |
| 2013/0249011 A1 | 9/2013 | Choi et al. | |
| 2013/0323875 A1* | 12/2013 | Park | H01L 31/02240 438/70 |
| 2014/0054743 A1 | 2/2014 | Hurwitz et al. | |
| 2015/0061147 A1 | 3/2015 | Lin et al. | |
| 2015/0069609 A1* | 3/2015 | Farooq | H01L 23/562 257/741 |

* cited by examiner

SEMICONDUCTOR DEVICES

CROSS-REFERENCE TO RELATED APPLICATION

This application claims the benefit of priority under 35 U.S.C. § 119 from Korean Patent Application No. 10-2015-0110564 filed on Aug. 5, 2015 in the Korean Intellectual Property Office, the disclosure of which is incorporated herein by reference in its entirety.

BACKGROUND

1. Field

Example embodiments of the inventive concepts relate to semiconductor devices.

2. Description of the Related Art

A complementary metal oxide semiconductor (CMOS) image sensor (CIS) is an element that converts an optical image into an electrical signal using CMOS fabrication technology. The CIS includes a number of metal oxide semiconductor (MOS) transistors equal to the number of pixels and sequentially detects outputs of the pixels using the MOS transistors. Using this switching method, the CIS converts signal electrons generated by the reaction with light into voltages and realizes image information through a signal processing process.

A typical image sensor may include photodiodes formed under a surface of a substrate, and logic circuits formed on the substrate. That is, the image sensor has a front illumination structure in which light is irradiated from an upper surface of the substrate.

In addition, a backside illumination (BSI) image sensor can be used. The BSI image sensor can minimize a step difference on a light-receiving unit by receiving light through the back of a wafer and eliminate the interference of light due to metal routing.

A bonding technology for implementing a BSI image sensor is classified as an oxide-to-oxide process and a metal-to-metal process, and a through silicon via (TSV) or a back via stack (BVS) technology applied to these processes is drawing a lot of attention.

In the TSV or BSV technology, an isolation structure may be formed between a plurality of terminals (e.g., through electrodes) in order to suppress the generation of leakage current. However, when a defect occurs in part of the isolation structure, the leakage current can still be generated.

SUMMARY

According to some example embodiments of the inventive concepts, semiconductor device may include a first conductive pattern in a first interlayer insulating film, a second conductive pattern in a second interlayer insulating film, the second interlayer insulating film being on the first interlayer insulating film, a through electrode partially penetrating through the first interlayer insulating film and the second interlayer insulating film, the through electrode electrically connecting the first conductive pattern and the second conductive pattern, a first pattern that completely surrounds side surfaces of the through electrode, a second pattern between the first pattern and the through electrode, the second pattern being separated from the first pattern and the through electrode, and a third pattern connecting the first pattern and the second pattern.

In some example embodiments, the first pattern, the second pattern and the third pattern may be integrally formed as a single pattern.

In some example embodiments, wherein upper surfaces of the first pattern, the second pattern and the third pattern may be on a first plane, and tower surfaces of the first pattern, the second pattern and the third pattern may be on a second plane.

In some example embodiments, the first pattern and the second pattern may surround and be separated from the through electrode, the first pattern and the second pattern may have a common center, and the through electrode may be positioned at the common center.

In some example embodiments, the third pattern may comprise a plurality of connecting parts extending in a direction intersecting the first pattern and the second pattern.

In some example embodiments, the first pattern, the second pattern and the third pattern may be on a same side of each of the first and second conductive patterns.

In some example embodiments, the third pattern may divide an area between the first pattern and the second pattern into a plurality of sub-areas.

In some example embodiments, a cross-section of the through electrode may be polygonal, circular, or oval.

In some example embodiments, the through electrode may comprise a first metal layer and a second metal layer on the first metal layer, and the first metal layer and the second metal layer may be different from each other.

According to some example embodiments of the inventive concepts, semiconductor device may include a first conductive pattern and a second conductive pattern in an interlayer insulating film and separated from each other, a first through electrode partially penetrating through the interlayer insulating film, the first through electrode being electrically connected to the first conductive pattern, a second through electrode partially penetrates through the interlayer insulating film, the second through electrode being electrically connected to the second conductive pattern, a first isolation structure surrounding side surfaces of the first through electrode, and a second isolation structure that surrounds side surfaces of the second through electrode, the first isolation structure including a first pattern completely surrounding the side surfaces of the first through electrode, a second pattern between the first pattern and the first through electrode, the second pattern being separated from the first pattern and the first through electrode, and a third pattern connecting the first pattern and the second pattern.

In some example embodiments, the first pattern may be between the first through electrode and the second through electrode.

In some example embodiments, the first pattern may be at equal distances from the first through electrode and the second through electrode.

In some example embodiments, the first through electrode may comprise a first metal layer and a second metal layer, the second metal layer being on the first metal layer, and the first metal layer and the second metal layer may comprise different materials.

In some example embodiments, the first metal layer may be conformally formed on sidewalls of a first trench, the first trench being within the interlayer insulating film.

In some example embodiments, the second conductive pattern may be symmetrical to the first conductive pattern, and the second isolation structure may be symmetrical to the first isolation structure.

According to some example embodiments of the present inventive concepts, a semiconductor device may include a first interlayer insulating film including silicon and being on a first layer, a second interlayer insulating film on the first interlayer insulating film, a second layer including silicon and being on the second interlayer insulating film, a first conductive pattern in the first interlayer insulating film, a second conductive pattern in the second interlayer insulating film, a through electrode completely penetrating through the second interlayer insulating film and the second layer, and the through electrode electrically connecting the first conductive pattern and the second conductive pattern, a first pattern in the second layer, the first pattern completely surrounding side surfaces of the through electrode, a second pattern between the first pattern and the first through electrode, the second pattern being separated from the first pattern and the through electrode, and a third pattern including a plurality of connecting parts, each of the plurality of connecting parts having a first side connected to the first pattern and a second side connected to the second pattern.

In some example embodiments, the first layer may comprise a first substrate, the second layer may comprise a second substrate or an epitaxial layer, the second substrate being different from the first substrate, and the first pattern, the second pattern and the third pattern may be only in the second layer.

In some example embodiments, the first pattern, the second pattern, and the third pattern may be integrally formed as a single pattern.

In some example embodiments, the connecting parts may be separated from each other.

In some example embodiments, the through electrode may partially penetrate through the first interlayer insulating film so as to contact the first conductive pattern, and the through electrode may have a tapered shape.

According to example embodiments, a semiconductor device includes a first through electrode extending through a semiconductor layer; and an isolation structure vertically extending through the semiconductor layer and along side surfaces of the first through electrode. The isolation structure includes a first pattern, a second pattern and a third pattern, the first and second patterns being arranged parallel to each other, and the third pattern extending from the first pattern to the second pattern.

The first, second and third patterns may be arranged in the form of a grid, the grid surrounding the side surfaces of the first through electrode.

The semiconductor device may further include a second through electrode extending through the semiconductor layer. The grid may be between the first and second through electrodes.

The third pattern may be non-perpendicular to the first and second patterns.

The third pattern may be connected to the first and second patterns at an acute or obtuse angle.

BRIEF DESCRIPTION OF THE DRAWINGS

The above and other features example embodiments of the present inventive concepts will become apparent to those of ordinary skill in the art by describing in detail example embodiments with reference to the attached drawings, in which.

DETAILED DESCRIPTION OF EXAMPLE EMBODIMENTS

Figure 1:
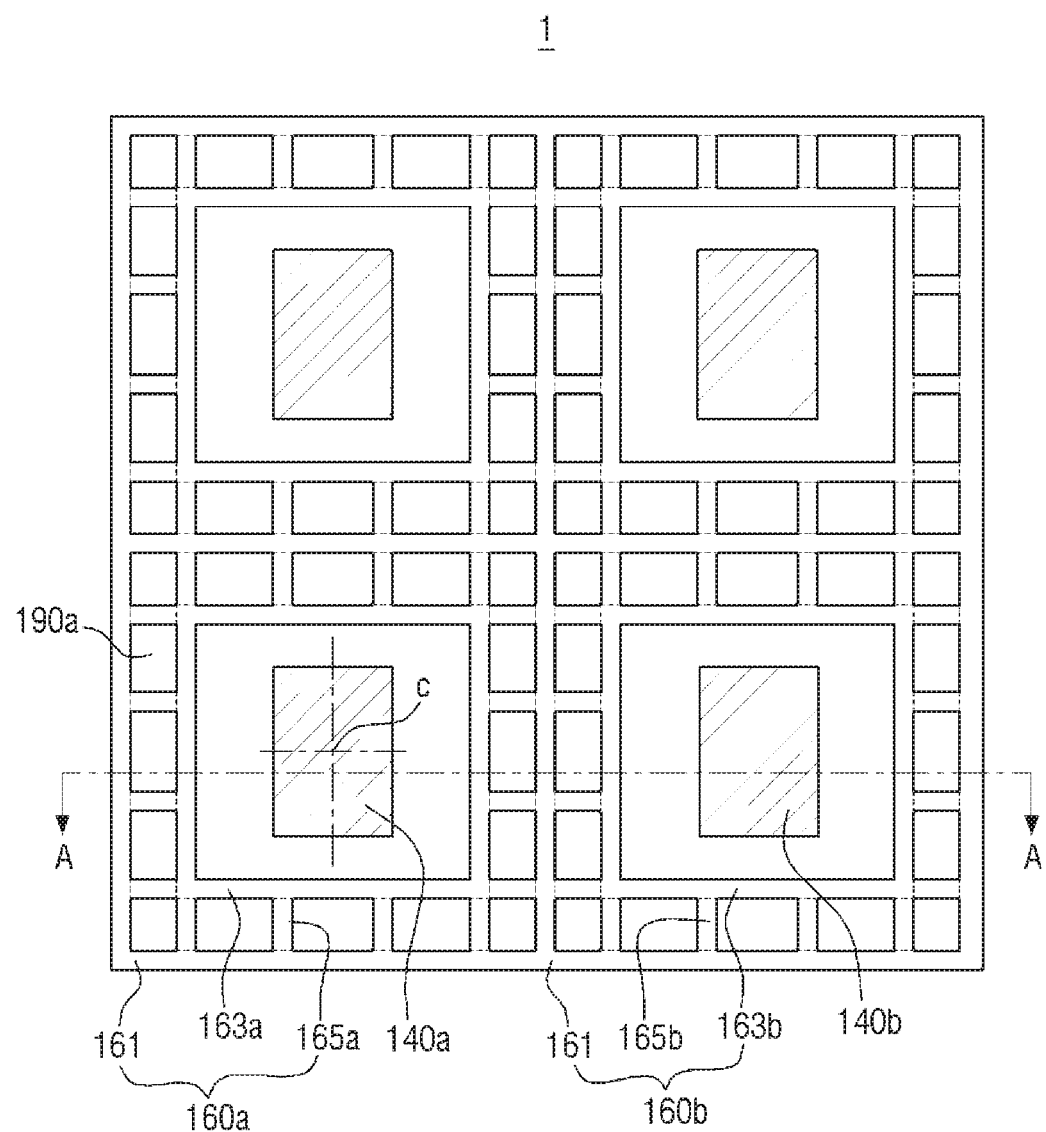
FIG. 1 illustrates a layout view of a semiconductor device according to some example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of the present inventive concepts.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments of the present inventive concepts.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present inventive concepts belongs. It will be further understood that terms, such as those defined in commonly used dictionaries, should be interpreted as having a meaning that is consistent with their meaning in the context of the relevant art and this specification and will not be an idealized or overly formal sense unless expressly so defined herein.

Hereinafter, semiconductor devices and methods of fabricating the same according to example embodiments of the present inventive concepts will be described with reference to FIGS. 1 through 17.

Figure 2:
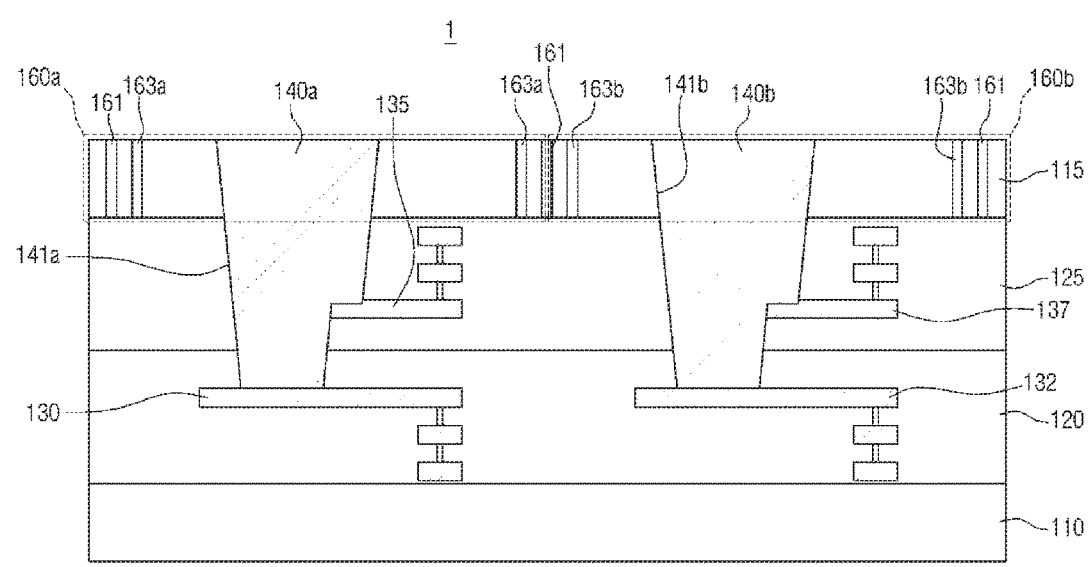
FIG. 2 illustrates a cross-sectional view taken along the line A-A of FIG. 1.

FIG. 1 illustrates a layout view of a semiconductor device according to some example embodiments. FIG. 2 is a cross-sectional view taken along the line A-A of FIG. 1.

Referring to FIGS. 1 and 2, a semiconductor device 1 according to some example embodiments may include a through silicon via (TSV) structure or a back via stack (BVS) structure. A semiconductor device of example embodiments of the present inventive concepts can be used in, but not limited to, a back side illumination (BSI) CMOS image sensor.

Specifically, the semiconductor device 1 according to some example embodiments may include a first layer 110, a first interlayer insulating film 120, a second layer 115, a second interlayer insulating film 125, a first conductive pattern 130, a second conductive pattern 135, a first through electrode 140a, a second through electrode 140b, a first isolation structure 160a, and a second isolation structure 160b.

The first layer 110 may be a semiconductor substrate. The substrate may include one of silicon (Si), strained silicon, a silicon alloy, silicon carbide (SiC), silicon germanium (SiGe), silicon germanium carbide (SiGeC), germanium (Ge), a germanium alloy, gallium arsenide (GaAs), indium arsenide (InAs), a III-V semiconductor and a II-VI semiconductor, or any combination or stack thereof. The first layer 110 may also be an organic plastic substrate instead of the semiconductor substrate. A case where the first layer 110 is made of silicon will hereinafter be described as an example.

The first layer 110 may be of a P type or an N type. In some example embodiments, the first layer 110 may be an insulating substrate. Specifically, the first layer 110 may be a silicon-on-insulator (SOI) substrate. When the SOI substrate is used, it is possible to reduce a delay time in the operation process of the semiconductor device 1.

The first interlayer insulating film 120 may be formed on the first layer 110. The first interlayer insulating film 120 may electrically insulate semiconductor elements disposed thereunder from semiconductor elements disposed thereon. The first interlayer insulating film 120 may include one of, e.g., silicon oxide, silicon nitride, silicon oxynitride, tetraethylorthosilicate (TEOS), flowable oxide (FOX), tonen silazen (TOSZ), undoped silicate glass (USG), borosilicate glass (BSG), phosphosilicate glass (PSG), borophosphosilicate glass (BPSG), plasma enhanced tetraethylorthosillicate (PETEOS), and a low-k material. Examples of the low-k material may include, but not limited to, fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, and a porous polymeric material.

In addition, the first interlayer insulating film 120 may be formed by, but not limited to, a physical vapor deposition (PVD) process, a chemical vapor deposition (CVD) process, an atomic layer deposition (ALD) method, a spin coating method, or a combination thereof.

The second interlayer insulating film 125 may be disposed near the first interlayer insulating film 120. The second interlayer insulating film 120 may be located on a side of the first interlayer insulating film 120, and the first layer 110 may be located on the other opposing side of the first interlayer insulating film 120. The second interlayer insulating film 125 and the first interlayer insulating film 120 may be formed of a same material using a same method, but example embodiments of the present inventive concepts are not limited thereto.

The second layer 115 may be disposed on the second interlayer insulating film 125. The second layer 115 may be located on a side of the second interlayer insulating film 125, and the first interlayer insulating film 120 may be located on the other opposing side of the second interlayer insulating film 125.

The second layer 115 may be a semiconductor substrate like the first layer 110 or an epitaxial layer. The second layer 115 may be a rigid substrate such as a substrate made of one or more semiconductor materials selected from the group comprising of Si, Ge, SiGe, GaP, GaAs, SiC, SiGeC, InAs and InP, a silicon on insulator (SOI) substrate, a quartz substrate or a glass substrate for displays or a flexible plastic substrate made of polyimide, polyethylene terephthalate (PET), polyethylene naphthalate (PEN), poly methyl methacrylate (PMMA), polycarbonate (PC), potyethersulfone (PES) or polyester.

In addition, the second layer 115 may be, but is not limited to, an epitaxial layer grown using any one of a solid phase epitaxy (SPE) technique, a liquid phase epitaxy (LPE) technique, and a vapor phase epitaxy (VPE) technique.

A plurality of semiconductor elements may be formed on a side of each of the first layer 110 and the second layer 115. For example, a transistor, a capacitor, a photodiode, a micro-lens, a color filter, etc. may be formed on the first layer 110 and the second layer 115, but example embodiments of the present inventive concepts are not limited thereto. The first layer 110 and the first interlayer insulating film 120 may be fabricated in a separate process from the second layer 115 and the second interlayer insulating film 125. Then, they may be bonded together. This will be described in detail later with reference to FIGS. 9 through 11.

The first conductive pattern 130 may be disposed in the first interlayer insulating film 120. The first conductive pattern 130 may be electrically connected to semiconductor elements that are formed on the first layer 110. The first conductive pattern 130 may include a heavily doped impurity region, a metal material, etc. The first conductive pattern 130 may be formed by, but not limited to, a first-end-of-the-line (FEOL) or back-end-of-the-line (BEOL) process.

The second conductive pattern 135 may be disposed in the second interlayer insulating film 125. The second conductive pattern 135 may be electrically connected to semiconductor elements that are formed on a side of the second layer 115. Like the first conductive pattern 130, the second conductive pattern 135 may include a heavily doped impurity region, and/or a metal material, etc. The second conductive pattern 135 may be, but is not limited to, substantially symmetrical to the first conductive pattern 130.

The first through electrode 140a may electrically connect the first conductive pattern 130 and the second conductive pattern 135. That is, the first through electrode 140a may penetrate through a part of the first interlayer insulating film 120 and a part of the second interlayer insulating film 125 to electrically connect the first conductive pattern 130 and the second conductive pattern 135. In addition, the first through electrode 140a may completely penetrate through the second interlayer insulating film 125 and the second layer 115. The first through electrode 140a may be formed in a first trench 141a which is formed in the second layer 115, the second interlayer insulating film 125, and the first interlayer insulating film 120.

The first through electrode 140a may include a conductive material. In some example embodiments, the first through electrode 140a may include, but not limited to, a metal with high conductivity. The first through electrode 140a may include a material such as Al, W or Ti. The first through electrode 140a may have a polygonal, circular, or oval cross section. In the drawings, the cross-section of the first through electrode 140a is, but not limited to, quadrilateral.

In the drawings, the first through electrode 140a has a tapered cross-sectional shape in which a width of an upper cross-section of the first through electrode 140a is less than a width of a lower cross-section thereof. However, the cross-sectional shape of the first through electrode 140a is not limited to the tapered shape. In some example embodiments, the first through electrode 140a may have a quadrilateral cross-sectional shape.

The second through electrode 140b may be substantially identical to the first through electrode 140a. However, the second through electrode 140b may be separated from the first through electrode 140a and electrically connect a third conductive pattern 132 and a fourth conductive pattern 137. Like the first through electrode 140a, the second through electrode 140b may penetrate through a part of the first interlayer insulating film 120 and a part of the second interlayer insulating film 125 to electrically connect the third conductive pattern 132 and the fourth conductive pattern 137. In addition, the second through electrode 140b may completely penetrate through the second interlayer insulating film 125 and the second layer 115. The second through electrode 140b may be formed in a second trench 141b that is formed in the second layer 115, the second interlayer insulating film 125, and the first interlayer insulating film 120.

The first isolation structure 160a may surround side surfaces of the first through electrode 140a, and the second isolation structure 160b may surround side surfaces of the second through electrode 140b. Both the first isolation structure 160a and the second isolation structure 160b may be located only in the second layer 115. Respective upper or lower surfaces of the first and second isolation structures 160a and 160b may be positioned on substantially a same plane. The first isolation structure 160a and the second isolation structure 160b may be, but are not limited to, substantially identical and symmetrical to each other. The first isolation structure 160a will hereinafter be described as an example.

The first isolation structure 160a may include a first pattern 161, a second pattern 163a, and a third pattern 165a.

Specifically, the first pattern 161 may completely surround the side surfaces of the first through electrode 140a. The first pattern 161 may be located only in the second layer 115. The first pattern 161 may be separated from the first through electrode 140a and surround the circumference of an upper part of the first through electrode 140a. The first pattern 161 may have a polygonal or circular shape. For example, the first pattern 161 may have a quadrilateral shape, and the first through electrode 140a may be located at the center of the quadrilateral. However, example embodiments of the present inventive concepts are not limited thereto.

The second pattern 163a may be located between the first pattern 161 and the first through electrode 140a and separated from the first pattern 161 and the first through electrode 140a. Therefore, the second pattern 163a may also completely surround the side surfaces of the first through electrode 140a and surround the circumference of the upper part of the first through electrode 140a. The second pattern 163a may be located only in the second layer 115. The second pattern 163a may have a polygonal or circular shape. For example, the second pattern 163a may be shaped like a quadrilateral, and the first through electrode 140a may be located at the centerof the quadrilateral. Here, the first pattern 161 and the second pattern 163a may have a common center C. However, example embodiments of the present inventive concepts are not limited thereto.

A distance between the second pattern 163a and the first pattern 161 may be constant. In addition, a distance between the second pattern 163a and the first through electrode 140a may be constant. However, this is merely an example embodiment, and example embodiments of the present inventive concepts are not limited to this example embodiment.

The third pattern 165a may connect the first pattern 161 and the second pattern 163a. The third pattern 165a may include a plurality of connecting parts extending in a direction that intersects the first pattern 161 and the second pattern 163a. For example, the third pattern 165a may include a plurality of connecting parts which connect the first pattern 161 and the second patter 163a by a shortest distance. That is, the third pattern 165a may be perpendicularly connected to the first pattern 161 and the second pattern 163a. The connecting parts may be separated from each other. In addition, the connecting parts may be arranged at regular intervals. However, example embodiments of the present inventive concepts are not limited thereto.

In addition, the third pattern 165a may divide an area between the first pattern 161 and the second pattern 163a into a plurality of sub-areas 190a. The sub-areas 190a may be formed as rectangular, triangular, or trapezoidal patterns. For example, when the third pattern 165a is perpendicularly connected to the first pattern 161 and the second pattern 163a, the sub-areas 190a may be rectangular. However, example embodiments of the present inventive concepts are not limited thereto.

The first pattern 161, the second pattern 163a and the third pattern 165a may be integrally formed as a single pattern in a single process. However, example embodiments of the present inventive concepts are not limited thereto, and the first pattern 161, the second pattern 163a and the third pattern 165a can be formed in different processes. The first pattern 161, the second pattern 163a, and the third pattern 165a may be made of a same material. The first pattern 161, the second pattern 163a, and the third pattern 165a may include an insulating material. For example, the first pattern 161, the second pattern 163a, and the third pattern 165a may include one of silicon oxide, silicon nitride, silicon oxynitride, TEOS, FOX, TOSZ, USG, BSG, PSG, BPSG, PETEOS, and a low-k material. Examples of the low-k material may include, but not limited to, FSG, CDO, xerogel, aerogel, amorphous fluorinated carbon, OSG, parylene, BCB, SiLK, polyimide, and a porous polymeric material.

Respective upper or lower surfaces of the first pattern 161, the second pattern 163a and the third pattern 165a may be positioned on substantially a same plane. To this end, a planarization process (e.g., a chemical mechanical polishing (CMP) process) may be used to align the upper surfaces of the first pattern 161, the second pattern 163a and the third pattern 165a with each other. In addition, the first pattern 161, the second pattern 163a and the third pattern 165a may be disposed on the same side of each of the first conductive pattern 130 and the second conductive pattern 135. The second layer 115 may be disposed between the first pattern 161, the second pattern 163a and the third pattern 165a. Here, the second layer 115 may include a silicon-containing material.

The first isolation structure 160a including the first pattern 161, the second pattern 163a and the third pattern 165a may electrically isolate the first through electrode 140a from other through electrodes.

The second isolation structure 160b may be substantially identical and symmetrical to the first isolation structure 160a. Accordingly, the first pattern 161 may be disposed in, or completely surround the side surfaces of, the first through electrode 140a and the second through electrode 140b and formed at equal distances from the first through electrode 140a and the second through electrode 140b.

Respective upper or lower surfaces of the second isolation structure 160b and the first isolation structure 160a may be positioned on substantially a same plane, but example embodiments of the present inventive concepts are not limited thereto.

Figure 3A:
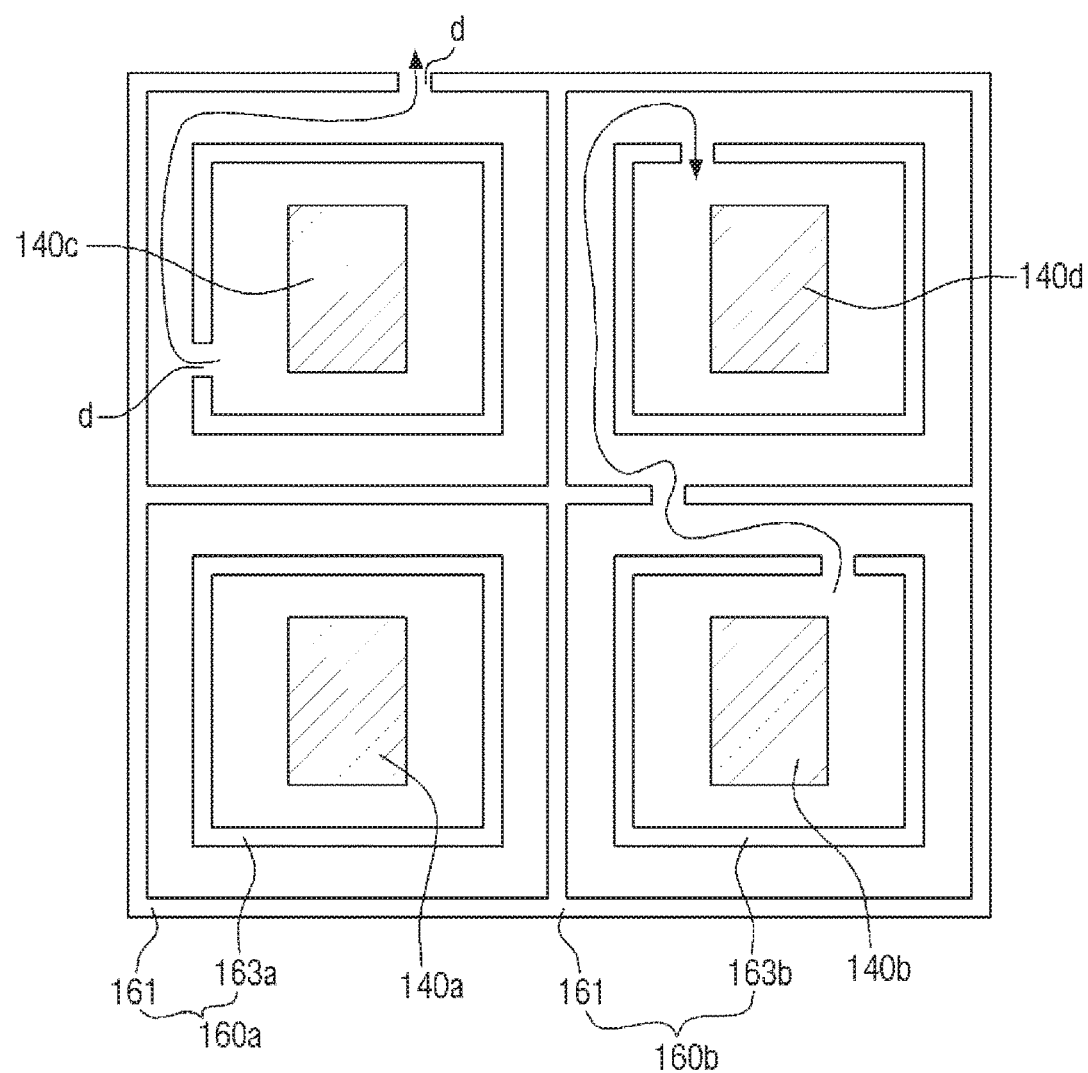
FIGS. 3A and 3B are views illustrating the effects of semiconductor devices according to some example embodiments.
Figure 3B:
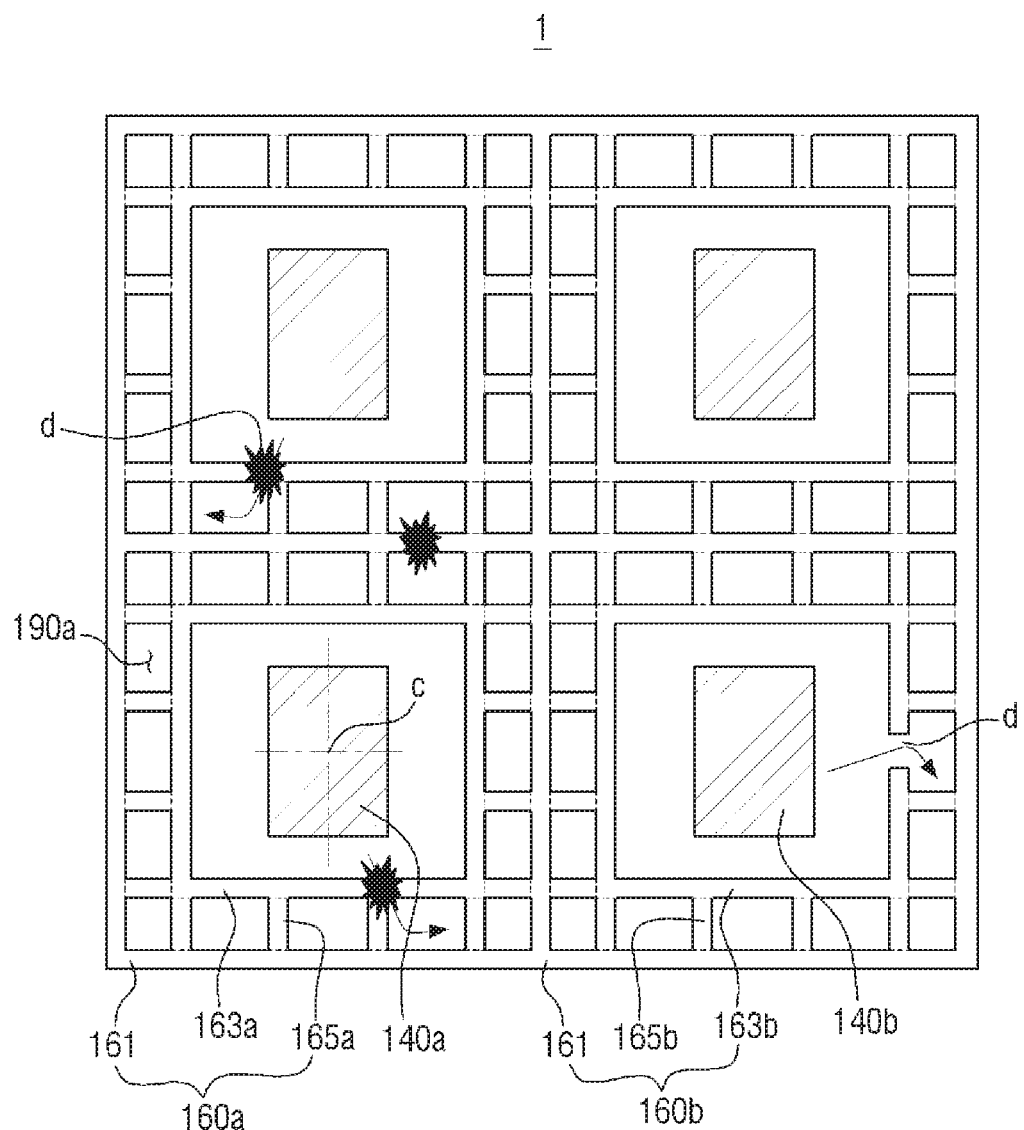

FIGS. 3A and 3B are views illustrating the effects of semiconductor devices according to some example embodiments.

FIG. 3A illustrates example embodiments in which a first pattern 161 and a second pattern 163a are disposed around a first through electrode 140a and a third pattern 165a is not formed. In FIG. 3A, defects d may be formed in the process of forming the first pattern 161 and the second pattern 163a. Due to the defects d of the first pattern 161 and the second pattern 163a, a current leakage path by which a second through electrode 140b and a fourth through electrode 140d are electrically connected to each other may be formed. Accordingly, current leakage may occur, which can cause a serious problem with the reliability of the semiconductor device of FIG. 3A. This can lead to a reduction in the yield of the semiconductor device.

FIG. 3B illustrates the semiconductor device 1 according to some example embodiments. In the semiconductor device 1, even if defects d are formed in the first pattern 161 and the second pattern 163a, a current leakage path leading to another through electrode may not be formed because the third pattern 165a functions as barrier ribs. That is, because the third pattern 165a divides a space between the first pattern 161 and the second pattern 163a into a plurality of sub-areas 190a, even if the defects d are formed in part of the first isolation structure 160a, the generation of leakage current between neighboring through electrodes can be prevented. Accordingly, an improvement can be expected in the yield and reliability of semiconductor devices according to example embodiments of the present inventive concepts. In addition, because the first isolation structure 160a including the third pattern 165a can be implemented by modifying the shape of a conventional photomask without an additional photomask or an additional process step, it is advantageous in terms of cost.

Figure 4:
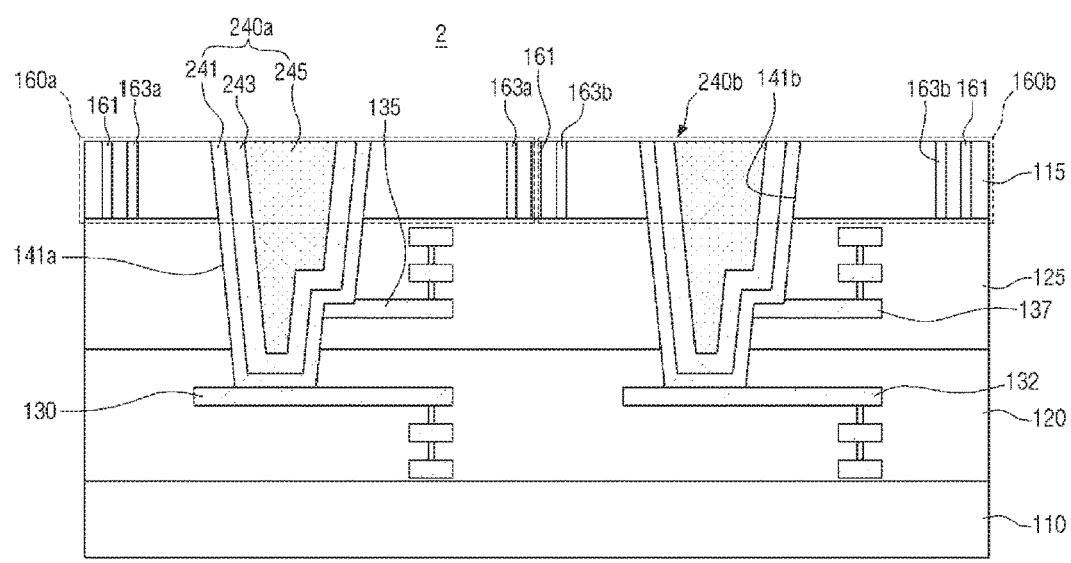
FIG. 4 illustrates a view of a semiconductor device according to some example embodiments.

FIG. 4 is a view of a semiconductor device according to some example embodiments. For simplicity, a redundant description of elements identical to those of the previous example embodiments will be omitted, and the current example embodiments will hereinafter be described, focusing mainly on differences with the previous example embodiments.

Referring to FIG. 4, a semiconductor device 2 may be substantially identical to the semiconductor device 1.

However, each of a first through electrode 140a and a second through electrode 140b of the semiconductor device 2 may include metal layers that contain different materials. The first through electrode 140a and the second through electrode 140b may have a substantially same structure. Hereinafter, the first through electrode 140a will be described as an example.

The first through electrode 140a may include a first metal layer 241, a second metal layer 243, and filler 245.

The first metal layer 241 may be conformally formed on sidewalls of a first trench 141a which is formed in a first interlayer insulating film 120 and a second interlayer insulating film 125. The first metal layer 241 may be formed to a uniform thickness. The first metal layer 241 may be made of, e.g., Al, W, Ti or a combination thereof or may have a multilayer structure composed of a metal nitride layer and a metal. The metal nitride layer may be, but is not limited to, TiN, TaN, or a combination thereof.

The second metal layer 243 may be formed on the first metal layer 241. The second metal layer 243 may be conformally formed on the first metal layer 241. The second metal layer 243 may be formed to have a uniform thickness. The second metal layer 243 may include a different material from the first metal layer 241. The second metal layer 243 may include a metal having high conductivity. Examples of the metal may include, but not limited to, W and Al.

The filler 245 may gap-fill the first trench 141a. Therefore, the filler 245 may be disposed on the second metal layer 243. The filler 245 may include a different material from the first metal layer 241 and the second metal layer 243. For example, the filler 245 may include, but not limited to, a carbon-based material.

In addition, voids such as air gaps may be formed inside the filler 245, but example embodiments of the present inventive concepts are not limited thereto.

Figure 5:
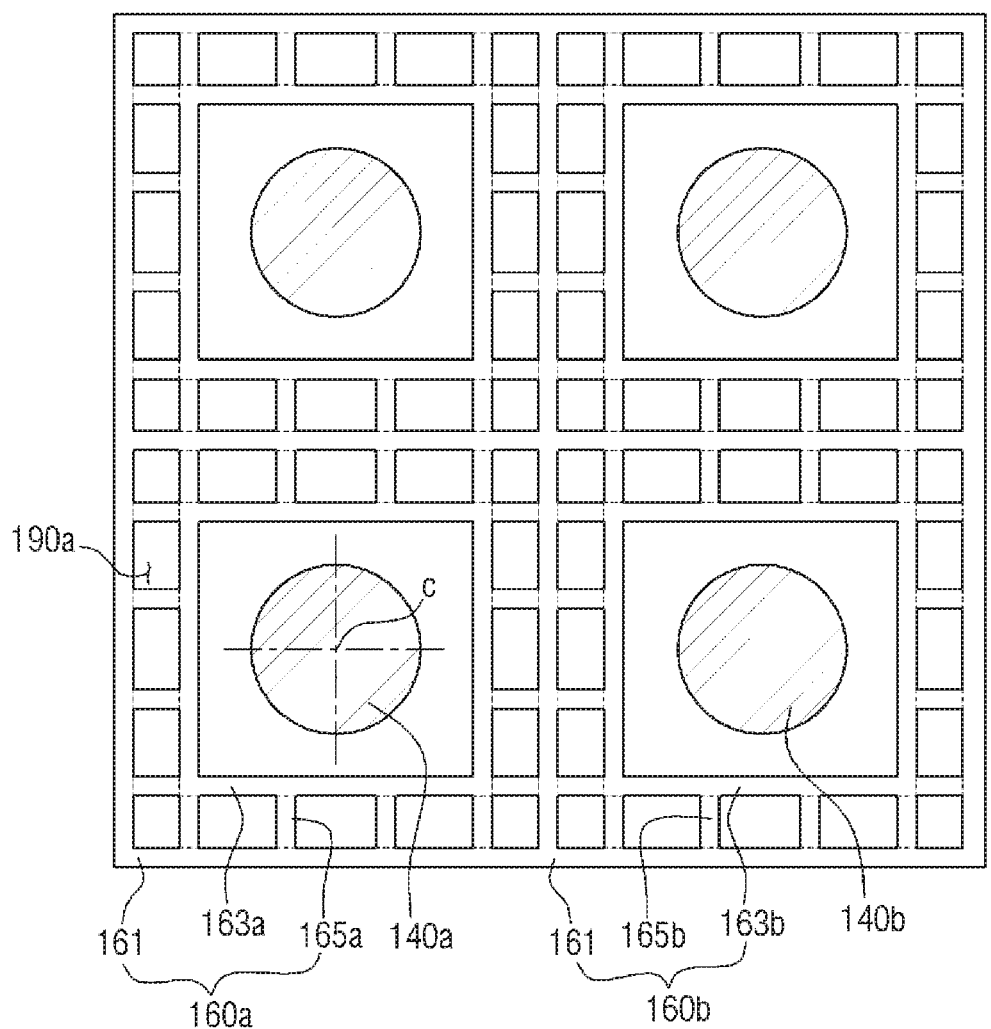
FIG. 5 illustrates a view of a semiconductor device according to some example embodiments.

FIG. 5 is a view of a semiconductor device according to some example embodiments. For simplicity, a redundant description of elements identical to those of the previous example embodiments will be omitted, and the current example embodiments will hereinafter be described, focusing mainly on differences with the previous example embodiments.

Referring to FIG. 5, a semiconductor device 3 may be substantially identical to the semiconductor device 1.

However, a cross-section of a first through electrode 140a of the semiconductor device 3 according to the third embodiment may be shaped like a polygon, a circle, an oval, or any closed curve. For example, the cross-section of the first through electrode 140a may be, but limited to, circular.

The first through electrode 140a may have the same shape as other through electrodes. The first through electrode 140a may be symmetrical to other through electrodes with respect to a first pattern 161. In addition, the first through electrode 140a may have a common center C with one cell of the first pattern 161. The first through electrode 140a may be located inside the first pattern 161 and separated from the first pattern 161. A silicon material may be disposed between the first through electrode 140a and the first pattern 161. However, example embodiments of the present inventive concepts are not limited thereto, and the first through electrode 140a can contact part of the first pattern 161.

Figure 6:
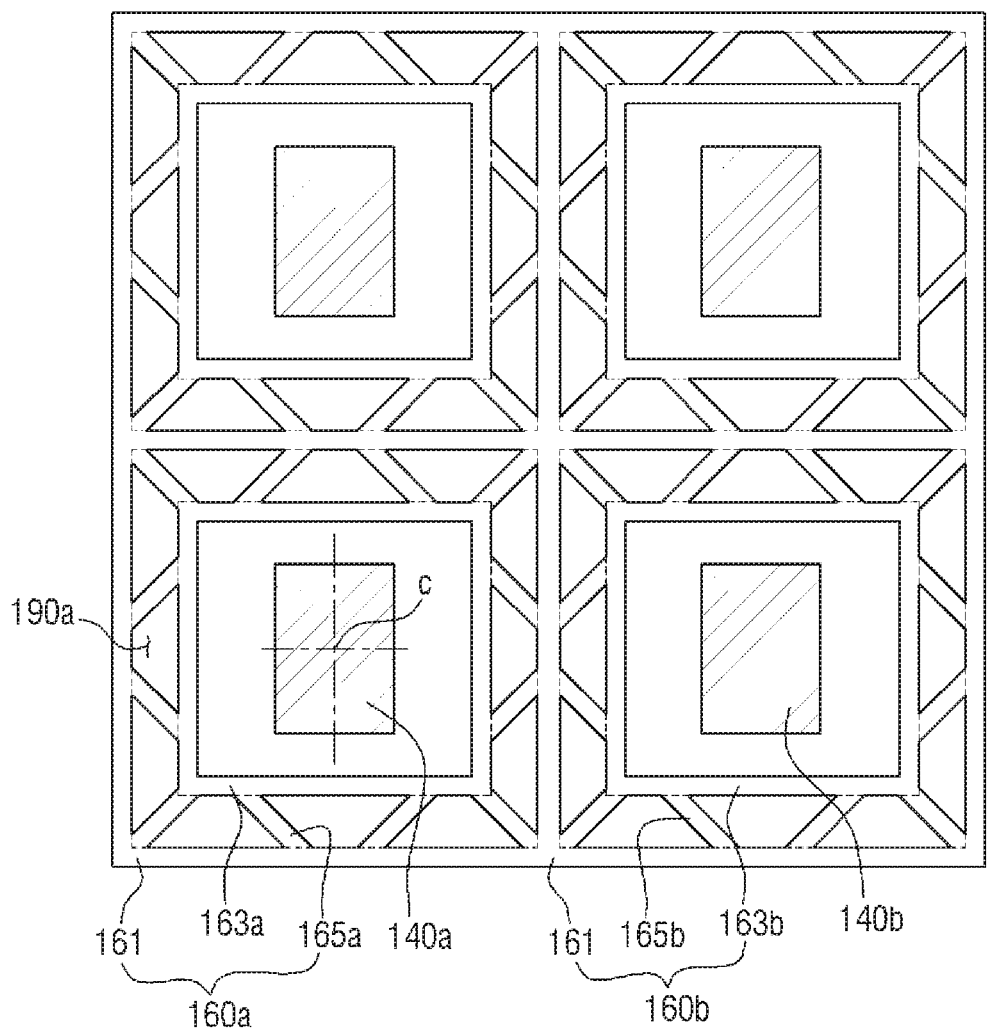
FIG. 6 illustrates a view of a semiconductor device according to some example embodiments.

FIG. 6 is a view of a semiconductor device according to some example embodiments. For simplicity, a redundant description of elements identical to those of the previous example embodiments will be omitted, and the current example embodiments will hereinafter be described, focusing mainly on differences with the previous example embodiments.

Referring to FIG. 6, a semiconductor device 4 may be substantially identical to the semiconductor device 1.

However, a third pattern 165a of the semiconductor device 4 may diagonally connect a first pattern 161 and a second pattern 163a. That is, the third pattern 165a may be connected to the first pattern 161 or the second pattern 163a at an obtuse angle or an acute angle. The third pattern 165a may include a plurality of connecting parts. Here, the connecting parts may be separated from each other.

The third pattern 165a may divide an area between the first pattern 161 and the second pattern 163a into a plurality of sub-areas 190a. Here, the sub-areas 190a may be formed as polygonal patterns such as triangular or trapezoidal patterns. For example, the third pattern 165a may obliquely connect the first pattern 161 and the second pattern 163a. Accordingly, the sub-areas 190a may be trapezoidal. The sub-areas 190a may be, but are not limited to, identical to each other.

Figure 7:
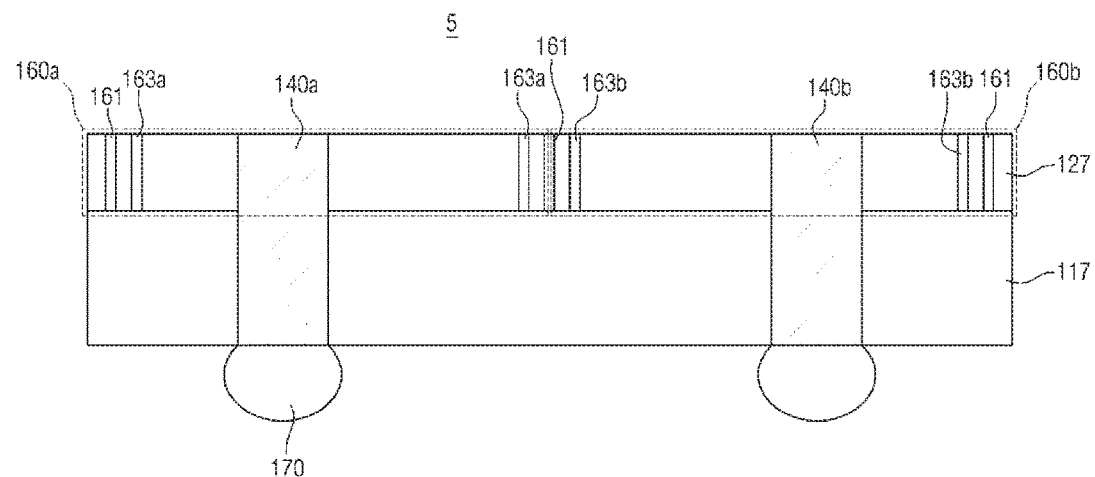
FIG. 7 illustrates a view of a semiconductor device according to some example embodiments.

FIG. 7 is a view of a semiconductor device according to some example embodiments. For simplicity, a redundant description of elements identical to those of the previous example embodiments will be omitted, and the current example embodiments will hereinafter be described, focusing mainly on differences with the previous example embodiments.

Referring to FIG. 7, a semiconductor device 5 may include a first layer 117, a second layer 127, a first through electrode 140a, a second through electrode 140b, a first isolation structure 160a, a second isolation structure 160b, and a connecting terminal 170.

The first layer 117 may electrically insulate semiconductor elements disposed thereunder from semiconductor elements disposed thereon. The first layer 117 may include one of, e.g., silicon oxide, silicon nitride, silicon oxynitride, TEOS, FOX, TOSZ, USG, BSG, PSG, BPSG, PETEOS, and a low-k material. Examples of the low-k material may include, but not limited to, FSG, CDO, xerogel, aerogel, amorphous fluorinated carbon, OSG, parylene, BCB, SiLK, polyimide, and a porous polymeric material.

The second layer 127 may contact the first layer 117. The second layer 127 may be a semiconductor substrate or an epitaxial layer. The second layer 127 may include one of Si, strained Si, a Si alloy, SiC, SiGe, SiGeC, Ge, a Ge alloy, GaAs, InAs, a III-V semiconductor and a II-VI semiconductor, or any combination or stack thereof. In some cases, the second layer 127 may be an organic plastic substrate instead of the semiconductor substrate.

The first through electrode 140a may have a TSV or BVS structure.

The first through electrode 140a may completely penetrate through the first layer 117 and the second layer 127. The first through electrode 140a may include a conductive material. In some example embodiments, the first through electrode 140a may include, but not limited to, a metal with high conductivity. The first through electrode 140a may include a material such as Al, W or Ti. In addition, the first through electrode 140a may consist of different metal layers.

In the drawing, the first through electrode 140a has a quadrilateral cross-sectional shape having a uniform width. However, the cross-sectional shape of the first through electrode 140a is not limited to the quadrilateral shape. In some example embodiments, the first through electrode 140a may have a tapered cross-sectional shape which becomes wider from the top toward the bottom.

The second through electrode 140b may have substantially the same structure as the first through electrode 140a. The second through electrode 140b may be separated from the first through electrode 140a.

The first isolation structure 160a may surround side surfaces of the first through electrode 140a, and the second isolation structure 160b may surround side surfaces of the second through electrode 140b. Both the first isolation structure 160a and the second isolation structure 160b may be located only in the second layer 127. Respective upper or lower surfaces of the first and second isolation structures 160a and 160b may be positioned on substantially a same plane. The first isolation structure 160a and the second isolation structure 160b may be, but are not limited to, identical and symmetrical to each other.

The first isolation structure 160a of the semiconductor device 5 is substantially identical to the first isolation structure 160a of the semiconductor device 1 described above with reference to FIGS. 1 and 2, and thus a detailed description thereof is omitted.

The connecting terminal 170 may be formed on a side of each of the first and second through electrodes 140a and 140b. The connecting terminal 170 may be a metal material (e.g., copper (Cu)) filled by an electroplating technique. In addition, the connecting terminal 170 may include, e.g., a solder ball. The connecting terminal 170 may be used to electrically connect the semiconductor devices 1 through 5 according to the example embodiments of the present inventive concepts to a printed circuit board (PCB), but example embodiments of the present inventive concepts are not limited thereto.

Figure 8:
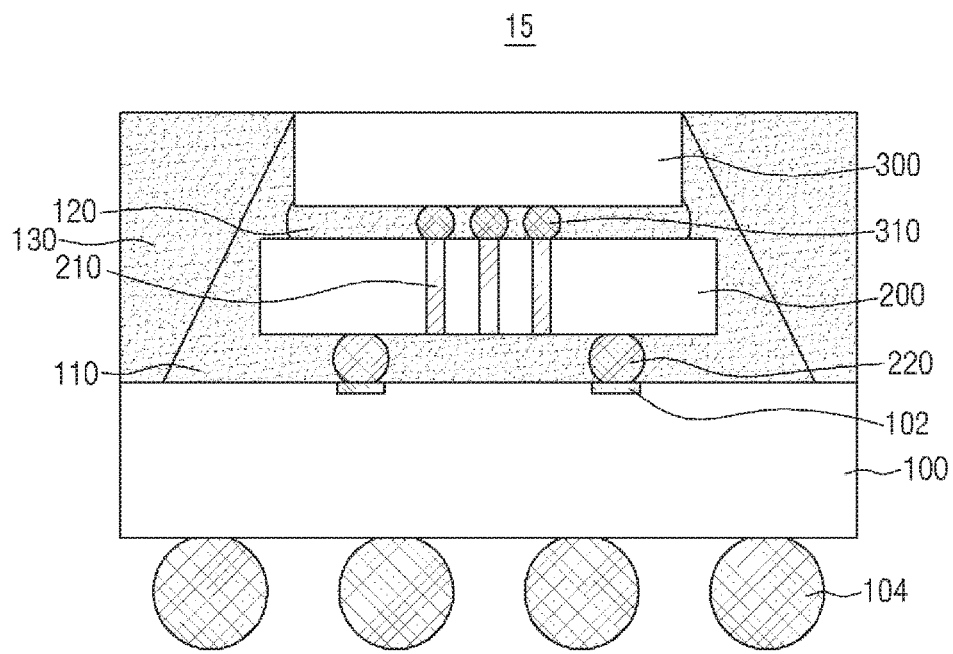
FIG. 8 illustrates a view of a semiconductor device according to some example embodiments.

FIG. 8 is a view of a semiconductor device according to some example embodiments. For simplicity, a redundant description of elements identical to those of the previous example embodiments will be omitted, and the current example embodiments will hereinafter be described, focusing mainly on differences with the previous example embodiments.

Referring to FIG. 8, a semiconductor device 15 may include a mounting substrate 100, a lower semiconductor chip 200, an upper semiconductor chip 300, a first underfill material 120, and a second underfill material 110.

The mounting substrate 100 may be a package substrate, for example, a PCB or a ceramic substrate. The mounting substrate 100 may include an upper surface and a lower surface that correspond to each other. External terminals 104 for electrically connecting the semiconductor device 15 to an external device may be formed on the lower surface of the mounting substrate 100. Bonding pads 102 may be electrically connected to the external terminals 104 that are electrically connected to the external device and supply electrical signals to the lower semiconductor chip 200 and the upper semiconductor chip 300. In some example embodiments, at least one of the bonding pads 102 may be, for example, a ground pad and electrically connected to a ground line in the mounting substrate 100. In the drawing, the bonding pads 102 are disposed in a central part of the mounting substrate 100. However, the position of the bonding pads 102 is not limited to the central part of the mounting substrate 100.

The lower semiconductor chip 200 and the upper semiconductor chip 300 are disposed on the mounting substrate 100. For example, the lower semiconductor chip 200 and the upper semiconductor chip 300 may be disposed on the mounting substrate 100 to overlap each other and may be stacked sequentially on the mounting substrate 100.

The first underfill material 120 is disposed on the lower semiconductor chip 200. The first underfill material 120 is interposed between the lower semiconductor chip 200 and the upper semiconductor chip 300. The first underfill material 120 bonds the lower semiconductor chip 200 and the upper semiconductor chip 300 together. The lower semiconductor chip 200, the first underfill material 120 and the upper semiconductor chip 300 are stacked sequentially on the mounting substrate 100.

Each of the lower semiconductor chip 200 and the upper semiconductor chip 300 may be, for example, a memory chip or a logic chip. When at least one of the lower semiconductor chip 200 and the upper semiconductor chip 300 is a logic chip, the lower semiconductor chip 200 and/or the upper semiconductor chip 300 may be designed variously in view of an operation to be performed. When at least one of the lower semiconductor chip 200 and/or the upper semiconductor chip 300 is a memory chip, the memory chip may be, for example, a nonvolatile memory chip. Specifically, the memory chip may be a flash memory chip. More specifically, the memory chip may be any one of a NAND flash memory chip and a NOR flash memory chip. However, the type of the memory chip according to the technical spirit of the present inventive concepts is not limited to the above examples. In some example embodiments of the present inventive concepts, the memory chip may include any one of a phase-change random access memory (PRAM), a magneto-resistive random access memory (MRAM), and a resistive random access memory (RRAM).

The lower semiconductor chip 200 may be electrically connected to the mounting substrate 100 by first connecting terminals 220 that are formed on the lower surface of the lower semiconductor chip 200. That is, the first connecting terminals 220 may electrically connect the lower semiconductor chip 200 and the bonding pads 102 of the mounting substrate 100. In the drawing, the first connecting terminals 220 are illustrated as solder balls, but the shape of the first connecting terminals 220 is not limited to the solder balls. The first connecting terminals 220 can also be solder bumps which are a combination of pillars and solder balls.

The lower semiconductor chip 200 may include through electrodes 210 that penetrate through the lower semiconductor chip 200. In FIG. 8, three through electrodes 210 are formed in the lower semiconductor chip 200. However, this is merely an example used for ease of description, and the number of the through electrodes 210 is not limited to three.

Here, the through electrodes 210 may be substantially identical to the first through electrode 140a and the second through electrode 140b of the semiconductor device 1 described above with reference to FIGS. 1 and 2.

In addition, an isolation structure may be formed around each of the through electrodes 210 to surround side surfaces of each of the through electrodes 210. Here, the isolation structure is substantially identical to the first isolation structure 160a and the second isolation structure 160b of the semiconductor device 1 described above with reference to FIGS. 1 and 2, and thus a detailed description thereof is omitted.

Through electrodes and isolation structures may be formed in the upper semiconductor chip 300 as in the lower semiconductor chip 200.

Figure 9:
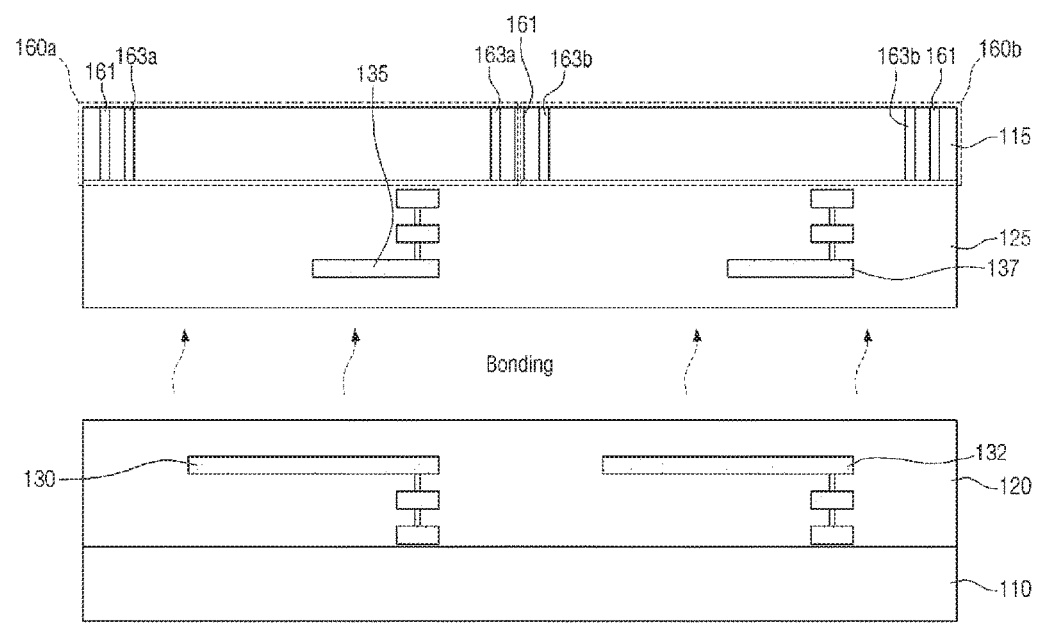
FIGS. 9 through 11 are views illustrating a method of fabricating a semiconductor device according to some example embodiments.
Figure 10:
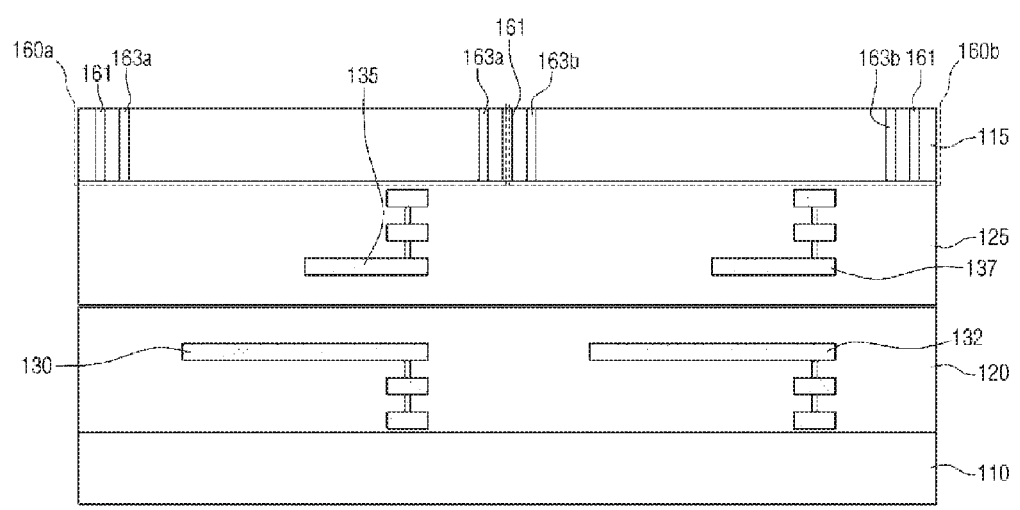
Figure 11:
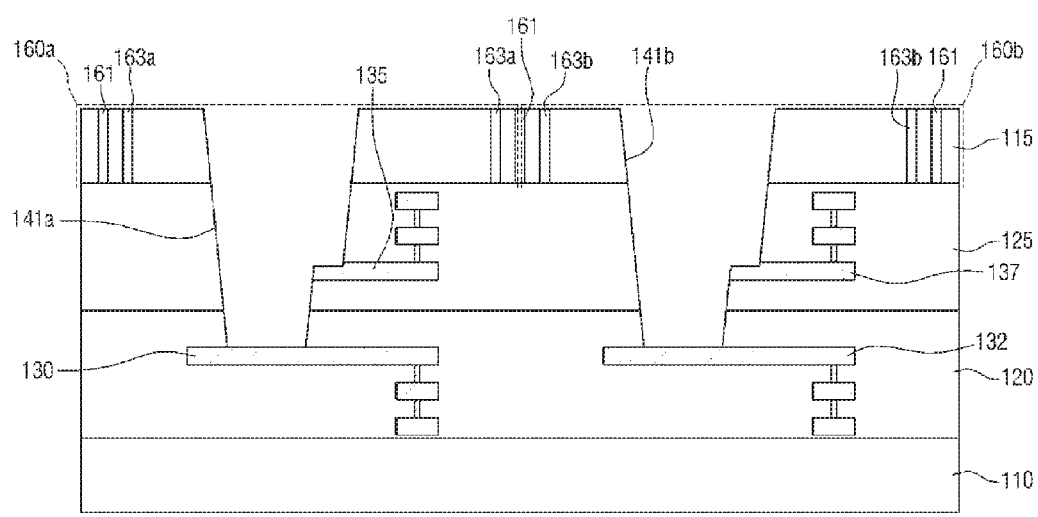

FIGS. 9 through 11 are views illustrating a method of fabricating a semiconductor device according to some example embodiments. For simplicity, a redundant description of elements identical to those of the previous example embodiments will be omitted, and the current example embodiments will hereinafter be described, focusing mainly on differences with the previous example embodiments.

Referring to FIG. 9, a first interlayer insulating film 120 and a first conductive pattern 130 may be formed on a first layer 110. The first interlayer insulating film 120 may consist of a plurality of layers. In the process of sequentially forming the layers, the first conductive pattern 130 may also be formed.

Similarly, a second interlayer insulating film 125 and a second conductive pattern 135 may be formed on a second layer 115. The second layer 115, the second interlayer insulating film 125, and the second conductive pattern 135 may be formed in a separate process from the above-described process, but example embodiments of the present inventive concepts are not limited thereto.

Here, each of the first layer 110 and the second layer 115 may include a substrate or an epitaxial layer, each of the first interlayer insulating film 120 and the second interlayer insulating film 125 may include an insulating material, and each of the first conductive pattern 130 and the second conductive pattern 135 may include a metal material.

Next, a first isolation structure 160a and a second isolation structure 160b may be formed in the second layer 115. The first isolation structure 160a and the second isolation structure 160b may be substantially identical to the first isolation structure 160a and the second isolation structure 160b of the semiconductor device 1 described above with reference to FIGS. 1 and 2, and thus a detailed description thereof is omitted.

Referring to FIGS. 9 and 10, a surface of the first interlayer insulating film 120 and a surface of the second interlayer insulating film 125 are placed to face each other, and then the first interlayer insulating film 120 and the second interlayer insulating film 125 may be bonded. The first interlayer insulating film 120 and the second interlayer insulating film 125 may be bonded together using an adhesive, and a thin adhesive layer may be formed between the first interlayer insulating film 120 and the second interlayer insulating film 125.

Accordingly, the first interlayer insulating film 120 may be located on a side of the second interlayer insulating film 125, and the second layer 115 may be located on the other side of the second interlayer insulating film 125. However, example embodiments of the present inventive concepts are not limited thereto.

Referring to FIG. 11, a first trench 141a and a second trench 141b may be formed to completely penetrate through the second layer 115 and the second interlayer insulating film 125 and expose a part of the first interlayer insulating film 120. Here, the first trench 141a may penetrate through a center of the first isolation structure 160a, and the second trench 141b may penetrate through a center of the second isolation structure 160b.

The first trench 141a may expose a part of the first conductive pattern 130 and a part of the second conductive pattern 135. The second trench 141b may expose a part of the third conductive pattern 132 and a part of the fourth conducive pattern 137. Each of the first trench 141a and the second trench 141b may have, but not limited to, a tapered shape.

Referring to FIG. 2, a first through electrode 140a and a second through electrode 140b may be formed to fill the first trench 141a and the second trench 141b, respectively. The first through electrode 140a may electrically connect the first conductive pattern 130 and the second conductive pattern 135. The second through electrode 140b may electrically connect the third conductive pattern 132 and the fourth conductive pattern 137. The second through electrode 140b may be formed in substantially a same manner as the first through electrode 140a.

The first through electrode 140a may include a conductive material. In some example embodiments, the first through electrode 140a may include, but not limited to, a metal having high conductivity. The first through electrode 140a may include a material such as Al, W or Ti. In addition, in some example embodiments, the first through electrode 140a may include a plurality of metal layers including different materials. The first through electrode 140a may have, but not limited to, a polygonal, circular, or oval cross section.

In the drawing, the first through electrode 140a has a tapered cross-sectional shape which becomes wide from the top thereof toward the bottom thereof. However, the cross-sectional shape of the first through electrode 140a is not limited to the tapered shape. In some example embodiments, the first through electrode 140a may be a quadrilateral cross-sectional shape.

Figure 12:
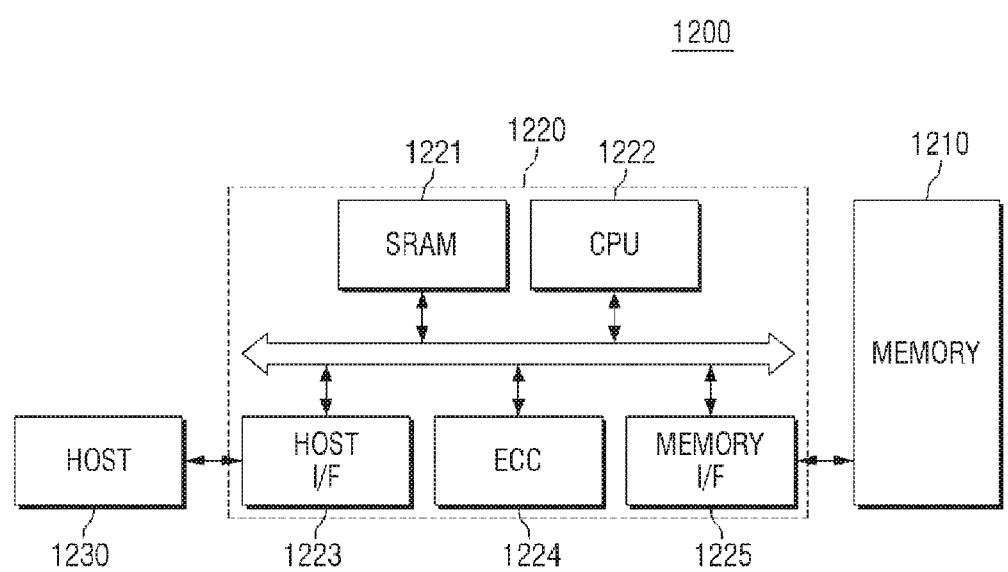
FIG. 12 is a block diagram of a memory card comprising semiconductor devices according to some example embodiments.

FIG. 12 is a block diagram of a memory card including semiconductor devices according to some example embodiments of the present inventive concepts.

Referring to FIG. 12, a memory 1210 including the semiconductor devices 1 through 5 according to various example embodiments of the present inventive concepts may be employed in a memory card 1200. The memory card 1200 may include a memory controller 1220 which controls data exchange between a host 1230 and the memory 1210. A static random access memory (SRAM) 1221 may be used as a working memory of a central processing unit (CPU) 1222. A host interface 1223 may include a protocol used by the host 1230 to access the memory card 1200 and exchange data with the memory card 1200. An error correction code (ECC) 1224 may detect and correct errors in data read from the memory 1210. A memory interface 1225 may interface with the memory 1210. The CPU 1222 may perform the overall control operation related to data exchange of the memory controller 1220.

Figure 13:
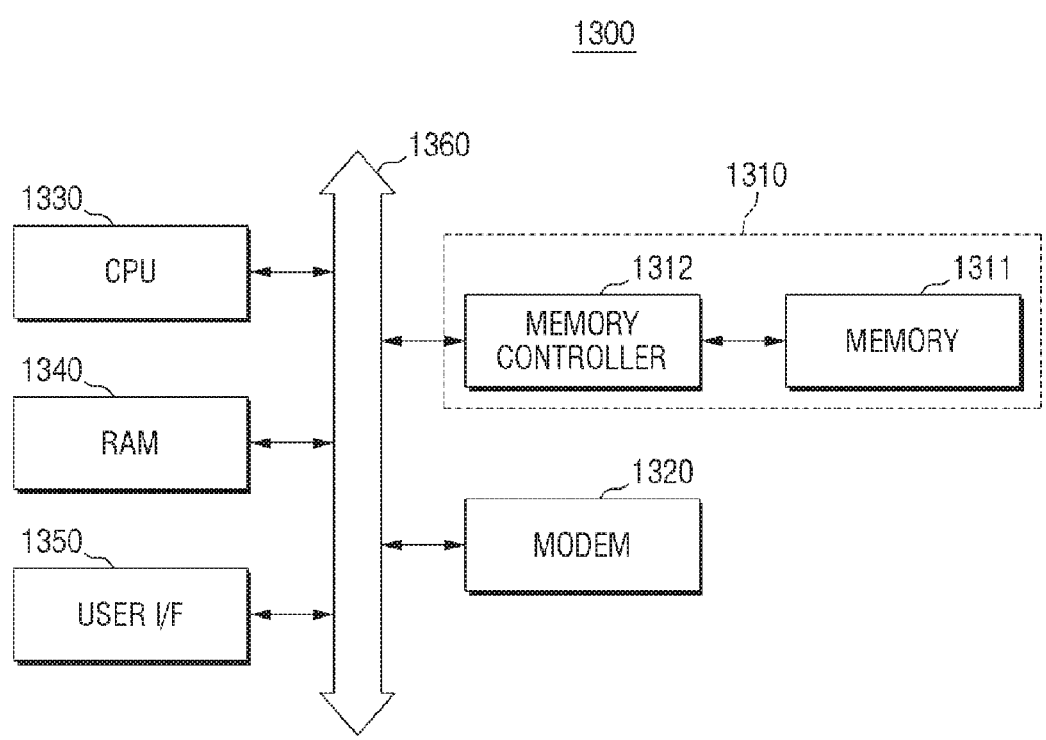
FIG. 13 is a block diagram of an information processing system using semiconductor devices according to some example embodiments.

FIG. 13 is a block diagram of an information processing system using semiconductor devices according to some example embodiments of the present inventive concepts.

Referring to FIG. 13, an information processing system 1300 may include a memory system 1310 including the semiconductor devices 1 through 5 according to various example embodiments of the present inventive concepts. The information processing system 1300 may include the memory system 1310, a modem 1320, a CPU 1330, a random access memory (RAM) 1340 and a user interface 1350 which are electrically connected to a system bus 1360. The memory system 1310 may include a memory 1311 and a memory controller 1312 and may have substantially the same configuration as the memory card 1200 of FIG. 9. Data processed by the CPU 1330 or data received from an external device may be stored in the memory system 1310. The information processing system 1300 can be applied to a memory card, a solid-state drive (SSD), a camera image sensor and various other chipsets. For example, the memory system 1310 may be configured to employ an SSD. In this case, the information processing system 1300 can process large-volume data in a stable and reliable manner.

Figure 14:
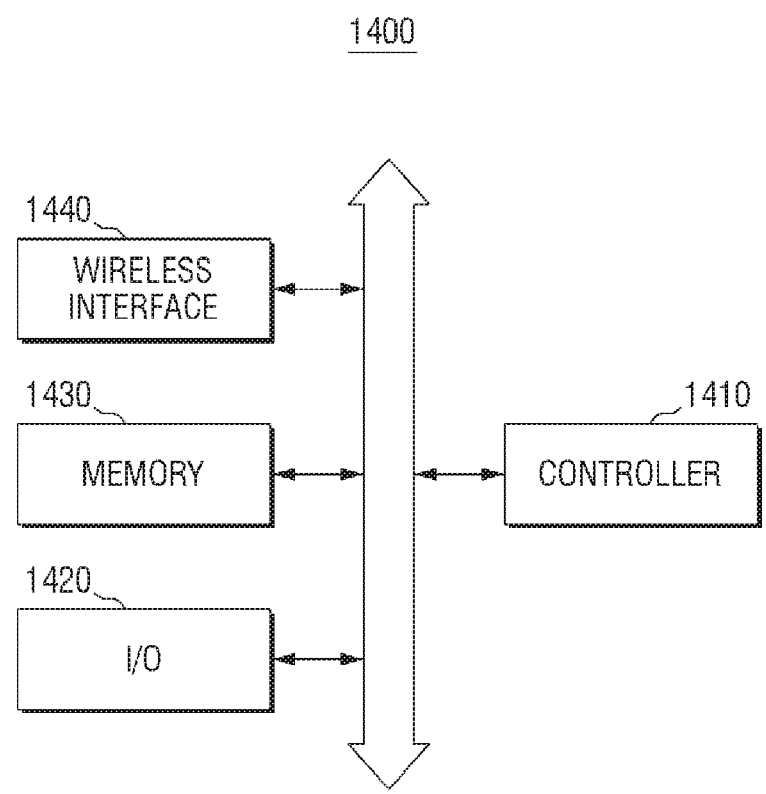
FIG. 14 is a block diagram of an electronic device comprising semiconductor devices according to some example embodiments.

FIG. 14 is a block diagram of an electronic device including semiconductor devices according to some example embodiments of the present inventive concepts.

Referring to FIG. 14, an electronic device 1400 may include the semiconductor devices 1 through 5 fabricated according to various example embodiments of the present inventive concepts. The electronic device 1400 can be used in wireless communication devices (such as personal data assistants (PDAs), notebook computers, portable computers, web tablets, wireless phones, and/or wireless digital music players) or in various devices that exchange information with each other in a wireless communication environment.

The electronic device 1400 may include a controller 1410, an input/output (I/O) device 1420, a memory 1430, and a wireless interface 1440. The memory 1430 may include semiconductor devices fabricated according to various example embodiments of the present inventive concepts. The controller 1410 may include a microprocessor, a digital signal processor, or the like. The memory 1430 may store commands (or user data) processed by the controller 1410. The wireless interface 1440 may be used to exchange data over a wireless data network. The wireless interface 1440 may include an antenna and/or a wireless transceiver. The electronic device 1400 may use a third-generation communication system protocol such as Code Division Multiple Access (CDMA), Global System for Mobile communication (GSM), North American Digital Cellular (NADC), Enhanced-Time Division Multiple Access (E-TDMA), Wideband CDMA (WCDMA), or CDMA-2000.

Figure 15:
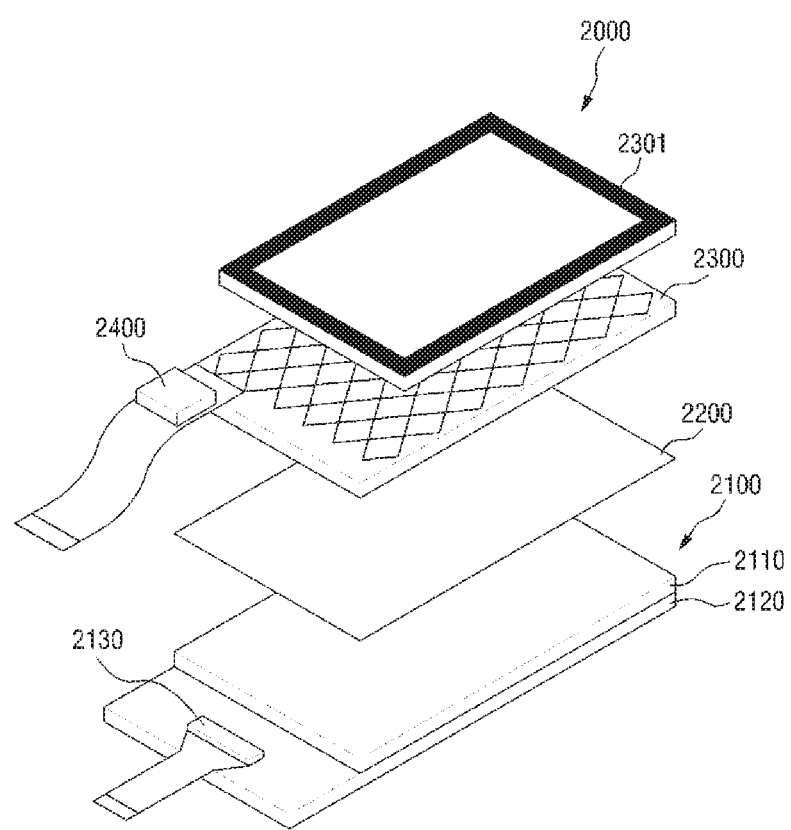
FIG. 15 illustrates a display module comprising semiconductor devices according to some example embodiments.

FIG. 15 illustrates a display module including semiconductor devices according to some example embodiments of the present inventive concepts.

Referring to FIG. 15, a display module 2000 may include a display device 2100, a polarizing plate 2200, and a window glass 2301. The display device 2100 includes a display panel 2110, a PCB 2120, and a display driver chip 2130.

The window glass 2301 is typically made of a material such as acrylic or tempered glass in order to protect the display module 2000 from external impact or scratches due to repeated touches. The polarizing plate 2200 may be provided to improve optical characteristics of the display panel 2110. The display panel 2110 is patterned as a transparent electrode on the PCB 2120. The display panel 2110 includes a plurality of pixel cells for displaying a frame. According to some example embodiments of the present inventive concepts, the display panel 2110 may be an organic light-emitting diode panel. Each of the pixel cells includes an organic light-emitting diode that emits light corresponding to the flow of an electric current. However, example embodiments of the present inventive concepts are not limited thereto, and the display panel 2110 can also include various types of display elements. For example, the display panel 2110 may be one of a liquid crystal display (LCD), an electrochromic display (ECD), a digital mirror device (DMD), an actuated mirror device (AMD), a grating light value (GLV), a plasma display panel (PDP), an electroluminescent display (ELD), a light-emitting diode (LED) display, and a vacuum fluorescent display (VFD).

The display driver chip 2130 may include the above-described semiconductor devices 1 through 5. In the current example embodiments, the display driver chip 2130 is provided as one chip. However, example embodiments of the present inventive concepts are not limited thereto, and a plurality of driver chips can be provided. In addition, the display driver chip 2130 can be mounted on the PCB 2120 in the form of chip-on-glass (COG). However, this is merely an example embodiment, and the display driver chip 2130 can be mounted in various forms such as chip-on-film (COF) and chip-on-board (COB).

The display module 2000 may further include a touch panel 2300 and a touch controller 2400. The touch panel 2300 is patterned as a transparent electrode, such as indium tin oxide (ITO), on a glass substrate or a polyethylene terephthalate (PET) film. The touch controller 2400 senses a touch on the touch panel 2300, calculates coordinates of the touch, and sends the calculated coordinates to a host (not illustrated). The touch controller 2400 can be integrated onto one semiconductor chip together with the display driver chip 2130.

Figure 16:
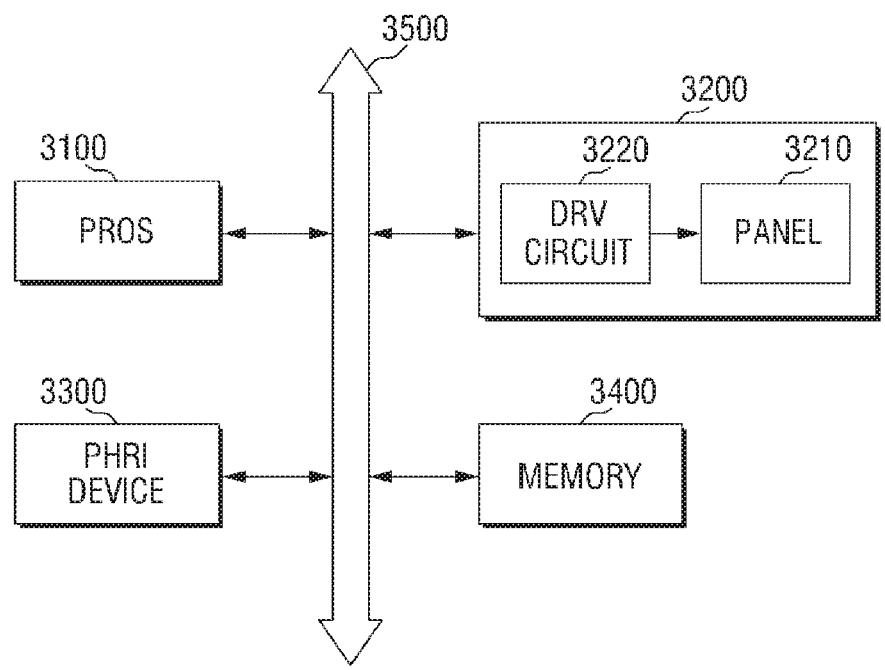
FIG. 16 illustrates a display system comprising semiconductor devices according to some example embodiments.

FIG. 16 illustrates a display system including semiconductor devices according to some example embodiments of the present inventive concepts.

Referring to FIG. 16, a display system 3000 may include a processor 3100, a display device 3200, a peripheral device 3300, and a memory 3400 which are electrically connected to a system bus 3500.

The processor 3100 may control data input and output of the peripheral device 3300, the memory 3400 and the display device 3200 and process images of image data transmitted among these devices. The above-described semiconductor devices 1 through 5 of example embodiments of the present inventive concepts can be applied in the display device 3200, the peripheral device 3300, and the memory 3400.

The display device 3200 includes a panel 3210 and a driver circuit 3220. The display device 3200 stores image data, which is received through the system bus 3500, in a frame memory included in the driver circuit 3220 and displays the stored image data on the panel 3210. Since the display device 3200 operates asynchronously with the processor 3100, the system load of the processor 3100 can be reduced.

The peripheral device 3300 may be a device (such as a camera, a scanner, a web camera, etc.) that converts a moving or still image into an electrical signal. Image data obtained by the peripheral device 3300 may be stored in the memory 3400 or displayed on the panel 3210 of the display device 3200 in real time.

The memory 3400 may include a volatile memory element such as a dynamic random access memory (DRAM) and/or a nonvolatile memory element such as a flash memory. The memory 3400 may be configured as a DRAM, a PRAM, an MRAM, a resistive random access memory (ReRAM), a ferroelectric random access memory (FRAM), a NOR flash memory, a NAND flash memory, and a fusion flash memory (e.g., a combination of an SRAM buffer, a NAND flash memory and a NOR interface logic). The memory 3400 may store image data obtained from the peripheral device 3300 or store an image signal processed by the processor 3100.

The display system 3000 according to example embodiments of the present inventive concepts may be included in a mobile electronic product such as a smartphone. However, example embodiments of the present inventive concepts are not limited thereto, and the display system 3000 can also be included in various types of electronic products that display images.

Figure 17:
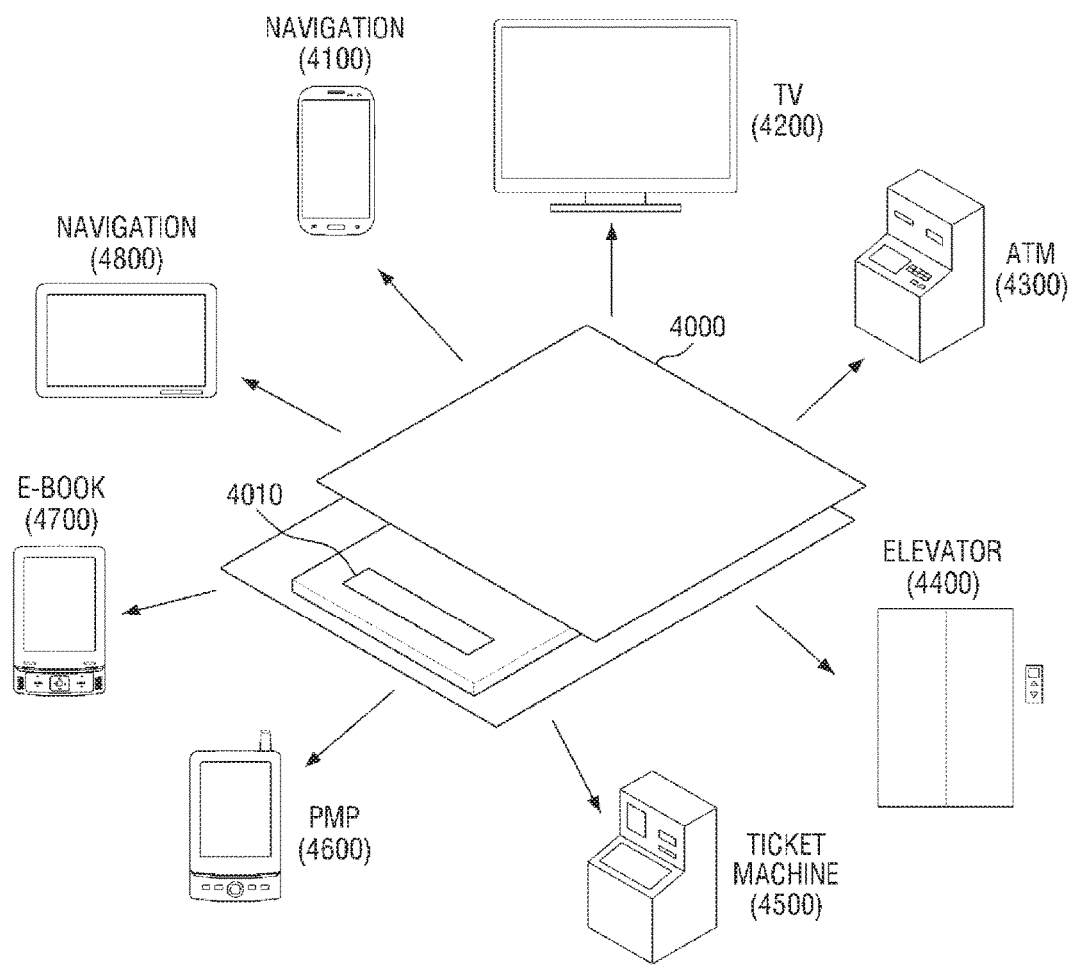
FIG. 17 illustrates various examples of an electronic product comprising semiconductor devices according to some example embodiments.

FIG. 17 illustrates various examples of an electronic product including semiconductor devices according to some example embodiments of the present inventive concepts.

The semiconductor devices 1 through 5 according to the example embodiments of the present inventive concepts may be included in a display device 4000. The display device 4000 can be employed in various electronic products. Specifically, the display device 4000 can be used not only in a mobile phone 4100, but also in a wide variety of electronic products including a television 4200, an automated teller machine (ATM) 4300 which automatically accepts, deposits and dispenses cash on behalf of a bank, an elevator 4400, a ticket machine 4500 which is used in, e.g., subway stations, a portable media player (PMP) 4600, an e-book 4700, and a navigation device 4800.

The display device 4000 according to some example embodiments of the present inventive concepts may operate asynchronously with a system processor. Therefore, the display device 4000 reduces the driving load of the processor, enabling the processor to operate at high speed with low power consumption. Consequently, the display device 4000 can improve functions of electronic products.

While the present inventive concepts has been particularly shown and described with reference to example embodiments thereof, it will be understood by those of ordinary skill in the art that various changes in form and details may be made therein without departing from the spirit and scope of example embodiments of the present inventive concepts as defined by the following claims. It is therefore desired that the present example embodiments be considered in all respects as illustrative and not restrictive, reference being made to the appended claims rather than the foregoing description to indicate the scope of the inventive concepts.

What is claimed is:
1. A semiconductor device, comprising:
a first insulating film including a first conductive pattern;
a semiconductor substrate on the first insulating film;
a second insulating film disposed between the first insulating film and the semiconductor substrate, and including a second conductive pattern;
a through electrode disposed in the semiconductor substrate, the first insulating film and the second insulating film, the through electrode electrically connecting the first conductive pattern and the second conductive pattern;
a first isolation pattern completely surrounding a circumference of the through electrode in plan view;
a second isolation pattern disposed between the first isolation pattern and the trough electrode, and completely surrounding the circumference of the through electrode in plan view; and
a third isolation pattern connecting the first isolation pattern and the second isolation pattern,
wherein each of the first isolation pattern, the second isolation pattern and the third isolation pattern completely passes through the semiconductor substrate,
wherein each of the first isolation pattern, the second isolation pattern and the third isolation pattern does not extend into the second insulating film, and
wherein the first isolation pattern, the second isolation pattern and the third isolation pattern are the same material.

2. The semiconductor device of claim 1, wherein the second isolation pattern is not in contact with the through electrode.

3. The semiconductor device of claim 2, a portion of the semiconductor substrate is interposed between the isolation pattern and the through electrode.

4. The semiconductor device of claim 1, portion of the semiconductor substrate is interposed between the first isolation pattern and the second isolation pattern.

5. The semiconductor device of claim 1, wherein the through electrode completely passes through the semiconductor substrate and the second insulating film.

6. The semiconductor device of claim 1, wherein the third isolation pattern includes a plurality of connecting parts extending in a direction intersecting the first isolation pattern the second isolation pattern.

7. A semiconductor device, comprising:
a first insulating film including a first conductive pattern;
a semiconductor substrate on the first insulating film;
a second insulating film disposed between the first insulating film and the semiconductor substrate, and including a second conductive pattern;
a first isolation pattern defining a first region and a second region in the semiconductor substrate;
a first through electrode disposed in the first region of the semiconductor substrate, the first insulating film and the second insulating film, the first through electrode electrically connecting the first conductive pattern and the second conductive pattern;
a second through electrode disposed in the second region of the semiconductor substrate, the first insulating film and the second insulating film, the second through electrode electrically connecting the first conductive pattern and the second conductive pattern;
a second isolation pattern disposed in the first region of the semiconductor substrate, and completely surrounding a circumference of the first through electrode in plan view;
a third isolation pattern disposed in the second region of the semiconductor substrate, and completely surrounding a circumference of the second through electrode in plan view; and
a fourth isolation pattern connecting between the first isolation pattern and the second isolation pattern, and between the first isolation pattern and the third isolation pattern,
wherein each of the first isolation pattern, the second isolation pattern, the third isolation pattern and the fourth isolation pattern completely passes through the semiconductor substrate,
wherein each of the first isolation pattern, the second isolation pattern, the third isolation pattern and the fourth isolation pattern does not extend into the second insulating film, and
wherein the first isolation pattern, the second isolation pattern, the third isolation pattern and the fourth isolation pattern are the same material.

8. The semiconductor device of claim 7, wherein the first isolation pattern surrounds each of the second isolation pattern and the third isolation pattern.

9. The semiconductor device of claim 7, wherein the second isolation pattern is not in contact with the first through electrode, and
wherein the third isolation pattern is not in contact with the second through electrode.

10. The semiconductor device of claim 7, wherein a portion of the semiconductor substrate is interposed between the first isolation pattern and the second isolation pattern, and between the first isolation pattern and the third isolation pattern.

11. The semiconductor device of claim 7, wherein the first conductive pattern includes a first part and a second part,
wherein the second conductive pattern includes a third part and a fourth part,
wherein the first through electrode electrically connects the first part of the first conductive pattern and the third part of the second conductive pattern, and
wherein the second through electrode electrically connects the second part of the first conductive pattern and the fourth part of the second conductive pattern.

12. The semiconductor device of claim 7, wherein each of the first through electrode and the second through electrode completely passes through the semiconductor substrate and the second insulating film.

13. The semiconductor device of claim 7, wherein the fourth isolation pattern includes a plurality of connecting parts connecting between the first isolation pattern and the second isolation pattern, and between the first isolation pattern and the third isolation pattern.

* * * * *